US012663490B2

(12) United States Patent
Alraddadi et al.

(10) Patent No.: US 12,663,490 B2
(45) Date of Patent: Jun. 23, 2026

(54) MRI COIL WITH AN EMBEDDED DIAGNOSTIC INTERFACE MODULE AND METHOD OF USE

(71) Applicants: Fahad Alraddadi, Pittsburgh, PA (US); William Monski, Sewickley, PA (US); Tobias Sun, Wexford, PA (US)

(72) Inventors: Fahad Alraddadi, Pittsburgh, PA (US); William Monski, Sewickley, PA (US); Tobias Sun, Wexford, PA (US)

( * ) Notice: Subject to any disclaimer, the term of this patent is extended or adjusted under 35 U.S.C. 154(b) by 0 days.

(21) Appl. No.: 17/850,407

(22) Filed: Jun. 27, 2022

(65) Prior Publication Data

US 2024/0241197 A1     Jul. 18, 2024

Related U.S. Application Data

(63) Continuation-in-part of application No. 17/673,522, filed on Feb. 16, 2022.

(51) Int. Cl.
*G01V 3/00* (2006.01)
*G01R 33/36* (2006.01)
*G01R 35/00* (2006.01)

(52) U.S. Cl.
CPC ............. *G01R 33/36* (2013.01); *G01R 35/00* (2013.01)

(58) Field of Classification Search
CPC .............. G01R 33/3692; G01R 33/307; G01R 33/34007; G01R 33/34046; G01R 33/481; G06T 11/005; G06T 2110/41
USPC .......................................................... 324/322
See application file for complete search history.

(56) References Cited

FOREIGN PATENT DOCUMENTS

CN 207731754 U * 8/2018
DE 69735287 T2 * 10/2006 ............. H02H 7/001

* cited by examiner

*Primary Examiner* — Walter L Lindsay, Jr.
*Assistant Examiner* — Frederick Wenderoth
(74) *Attorney, Agent, or Firm* — Gary P. Topolosky

(57) ABSTRACT

An MRI coil having embedded therein a Diagnostic Interface Device (or DID); means for plugging the embedded DID of the MRI coil to a frequency-testing power source, said embedded DID adapted for: (a) measuring the status of certain key electrical conditions for the coil; (b) receiving a response back from the signals initially aimed at the coil in question; (c) processing those responses received; and (d) transferring the measured electronic status (using a specific code number for the coil) to a remote storage area on the internet. A method of use is also disclosed.

19 Claims, 8 Drawing Sheets

RF and DC Testing Method

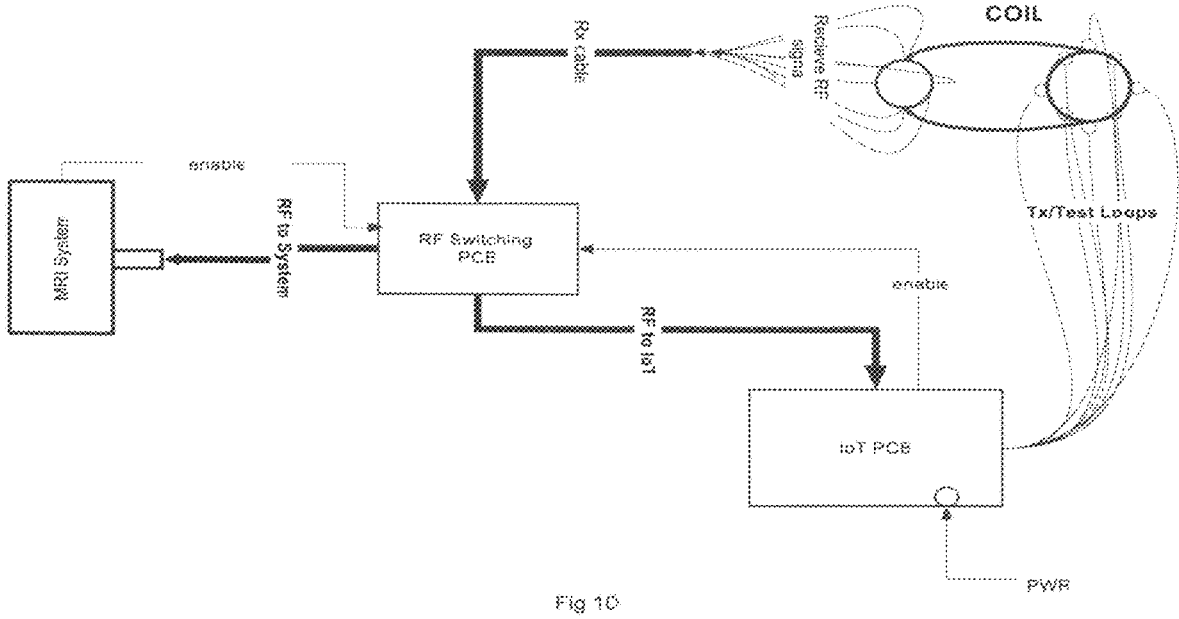

Fig 10

An example of a channel – could be one of 4, 8, 16, etc. channel systems

This diagram shows the complete RF/DC routing paths from/to IoT, coil and MRI system.

1. RF switching PCB is made of multiple RF switching ICs (for example HMC7992) and voltage regulators (for example L78L33) with their supporting components. The number of RF switching ICs used depends on how many channels the MRI coil has.
2. COIL (upper right) is the unit under test and it could be a receive only or Transmit/Receive coil
3. The MRI system block will provide the power and logic A/B (as seen in Fig. 11) for the RF switching ICs via 10v DC.
4. There are two possible events in this diagram,
   - Enable 1 - When the coil is in use (plugged in the MRI system), the coil works as an imaging apparatus and there is no IoT diagnostic testing of the coil happening. The MRI system will provide all needed voltages and logic lines for the RF switching PCB to route all coil channels to MRI system
   - Enable 2 - When the coil is not in use (not plugged in the MRI system) the coil channels are routed to IoT for diagnostic testing. All needed voltages and logic for the RF switching PCB will be provided by the IoT PCB. PWR is external.

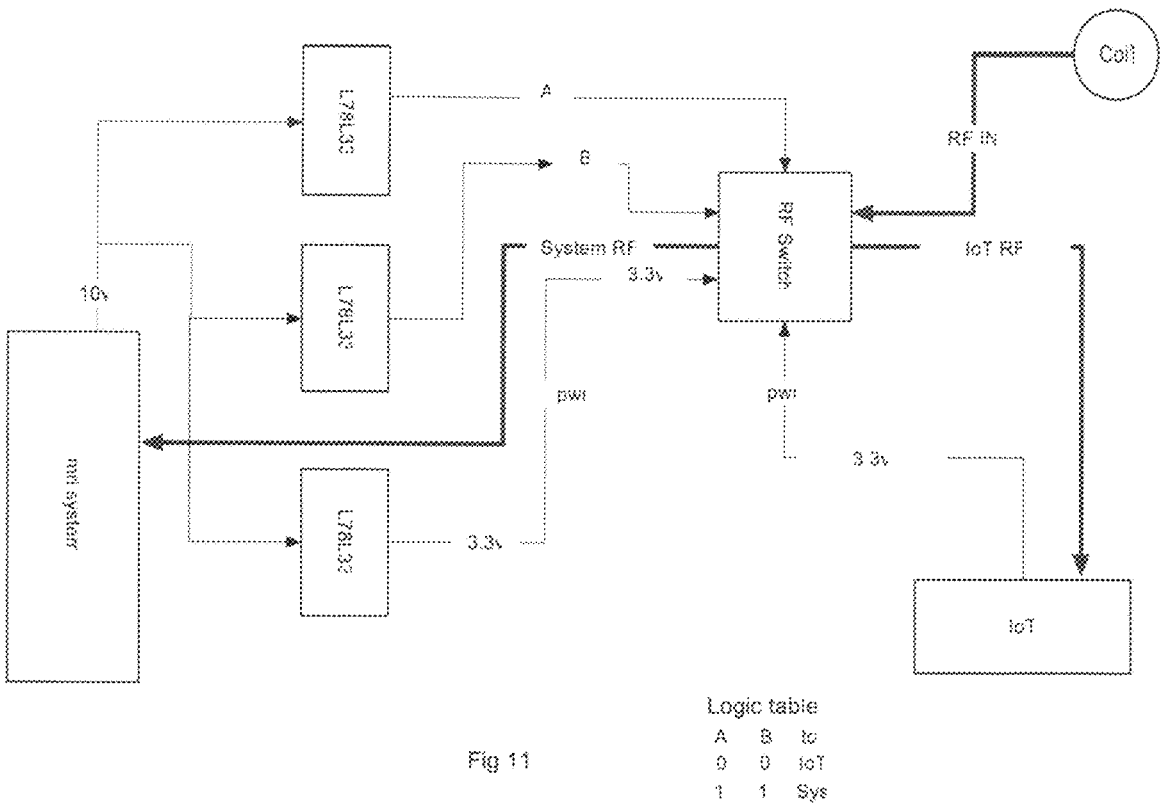

Fig 11

Logic table
| A | B | to |
|---|---|-----|
| 0 | 0 | IoT |
| 1 | 1 | Sys |

Fig 11 is a one channel example like that in Fig 10;

- MRI system block represent the MRI system and all its electronics
- L78L33 blocks are the voltage regulators (3 are shown) needed to convert the 10v DC to 3.3v DC for both power and logic (see above flow arrows A&B and PWR). The RF switch block is the RF switching IC and its supporting components.
- The coil is the MRI coil
- The IoT block is the IoT PCB
- the switching between IoT and System is based on the logic explained in the representative Logic table (above)

MRI COIL WITH AN EMBEDDED DIAGNOSTIC INTERFACE MODULE AND METHOD OF USE

REFERENCE TO RELATED APPLICATIONS

This application is a continuation-in-part of application Ser. No. 17/673,522, filed on Feb. 16, 2022, which was a perfection of Provisional Application Ser. No. 63/149,896, filed on Feb. 16, 2021, Application Ser. No. 63/192,772, filed on May 25, 2021, and Application Ser. No. 63/192,799, also filed on May 25, 2021, all disclosures of which are fully incorporated by reference herein.

STATEMENT OF GOVERNMENT INTEREST

Not Applicable

STATEMENT AS TO RIGHTS TO INVENTIONS MADE UNDER FEDERALLY SPONSORED RESEARCH OR DEVELOPMENT

Not Applicable.

NAMES OF THE PARTIES TO A JOINT RESEARCH AGREEMENT

Not Applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not Applicable.

STATEMENT REGARDING PRIOR DISCLOSURES BY THE INVENTOR OR A JOINT INVENTOR

Not Applicable.

BACKGROUND OF THE INVENTION (1) Field of the Invention. The present invention relates to an MRI coil having an embedded monitoring device or system for predicting a hard or soft failure. It further relates to a method for using such a coil to predict coil failures before inaccurate scans/tests are otherwise performed with such analytic equipment A handheld variation is also envisioned. The dashboard display for use with the foregoing versions includes proprietary elements. The various inventions may be marketed under the "Echo" brand name.

A magnetic resonance imaging (MRI) apparatus that performs magnetic image processing of a patient, the body part of a patient, or possibly an inanimate object. Such apparatus include a magnet system with a plurality (i.e., one or more) magnetic coils that form a gradient magnetic field and a static magnetic field. The typical MRI apparatus includes both an RF coil element and a DC element.

For a magnetic resonance imaging apparatus that uses a superconducting magnet, once a coil failure occurs, the operating state of the apparatus/system is compromised. Either a fuzzy, unusable image results (a soft fail) or the machine produces no image whatsoever (a hard fail).

The Internet of Things (IOT) is used in a variety of applications. This invention will be useful to owners and operators of MRI apparatus. This invention will save time and money but most importantly, it will improve patient care by identifying MRI coil failures before they occur.

This invention will monitor important characteristics of an MRI coil when the MRI apparatus/machine is not in use. The device hereinbelow will transmit resulting monitored data to applicable MRI service organizations and end users. When used, this invention will help detect a soft or a hard failure of one or more of the MRI coils in an apparatus.

MRI machines are an important diagnostic tool used in modern medicine every day. MRI coils are essential components of those machines. These coils are necessary for acquiring the MR images generated by such MRI equipment. Currently, there is no way to know when an MRI coil is going to fail until it is being utilized during an MRI exam. When an MRI coil fails, the MRI procedure must be stopped, and the MRI exam rescheduled sometime after the coil is replaced.

2. Potentially Relevant Art—Though this invention clearly distinguishes over both prior art references, see generally Nerreter U.S. Pat. No. 8,373,417 and JP2003079596.

BRIEF SUMMARY OF THE INVENTION

This invention will consist of an Embedded Diagnostic Interface Module (or EDIM) built into a newly made MRI coil. By utilizing the Internet of Things (IOT), or more specifically a dashboard kept on the web, this invention will enable its user(s) to remotely monitor the status of one or more MRI coils for an apparatus/MRI machine. The device, and related method of use, will detect if any such coils may have already failed, or may possibly malfunction in the imminent future—before the failure of one or more coils disrupts the flow of an MRI apparatus in operation.

In one embodiment, the device for remotely diagnosing MRI coils comprises: (i) a Diagnostic Interface Device (or DID); and (ii) means for connecting (read: plugging) that DID to an MRI coil for testing when the MRI apparatus is not in use. The invention (both device and method) are adapted for: (a) measuring the status of certain key electrical conditions for the coil; (b) receiving a response back from the signals initially aimed at the coil in question; (c) processing those responses received; and then (d) transferring the measured electronic status (using a specific code number for the coil) to a remote storage area on the internet. Included with the foregoing DID device is a microprocessor, more specifically a microcontroller, for pushing through a transmitter one or more RF signals (or sine waves) aimed at the MRI coil to be tested. The MRI coil responds to the signal coming from the transmit antennae. Additional DID components include: a gain block (or other amplifier variety); an RF input signal mixer; a bias tee between the gain block and RF signal mixer; a signal filtration (or low-pass filter) and a DC offset. These all make up the DID hardware encapsulated in one "box" like the component pictured in accompanying FIG. 9. As a whole, the system will use an analog-to-digital converter (or ADC, for short) to convert measured signal transmissions and bounce-back returns into digital data from which a center frequency will be calculated. Ideally, the device will take a plurality of readings (or data points) per coil being tested. One such variety of machine may include 20, 30, 40, 50, 60 or more points per coil (or coil sections) being tested.

The system is meant to be forgiving of accidental misreadings (or bumps). In fact, before an alarm or other warning may sound, this invention is meant to require multiple deviations (perhaps two, preferably three or more) from the return signal range observed before that MRI coil is flagged for being broken, or on the verge of a failure.

A method for predicting MRI coil failures comprises the steps of: (a) providing a Diagnostic Interface Device DID (such as is described above) and incorporating (or otherwise embedding) said device into the coil during its initial construction/assembly; (b) sending electronic signals into the DID of the MRI coil to be tested; (c) receiving signals back from the MRI test coil; (d) controlling traffic/data control flow of PLD responses received from the MRI test coil with a DSB inside the microprocessor; (e) digitizing those flow of responses; (f) performing signal processing on these digitized MRI coil responses; and then (g) transferring the signal processed responses to a remote storage area, such as the internet, where the responses can be periodically reviewed and compared against an established norm for the coil in question so as to evaluate/diagnose said coil and/or predict if it hasn't already failed, when a soft or hard coil failure may be imminent.

BRIEF DESCRIPTION OF THE DRAWING(S) AND PHOTOGRAPH(S)

In the accompanying drawings and photographs, some numerical quantities are provided. They are suggestive or representative, however, for one sample version/variation/embodiment of this invention. Further features, objectives and advantages will become clearer when reviewing the following description of preferred embodiments made with reference to the accompanying drawings and photographs in which:

FIG. 1 illustrates a block diagram showing one preferred version of this invention. In this block diagram, it should be noted that the red arrow loop represents the section of the DID responsible for transmitting an RF signal that the test MRI coil will pick up; the blue arrow loop represents the section of the DID responsible for receiving that RF signal returned from the test MRI coil; and the green arrow loop represents the section of the DID responsible for manipulating the received RF signal for the ADC and microcontroller. Here, the received signal from the MRI coil and a local oscillator (LO) signal are mixed, filtered, then shifted so that the ADC can properly digitize said signal for the microcontroller;

FIG. 2 illustrates a microcontroller that will be used to program the IDT chip and route the receiving signal to be digitized to the ADC. A dsPIC microcontroller will be used since it contains a 3.5 Msps Analog-to-Digital Converter (or ADC) that is sufficiently fast to digitize the returned/received signal. Note that the motherboard of this microcontroller has integrated in a sine wave generator board whose purpose is to transmit a desired RF signal to the coil element under test for exciting that element and testing its functionality. In one embodiment, the microcontroller pushes a 63.87 MHz sine wave using an IDT 8V97051 chip programmed using an SPI interface;

FIG. 3 is a small signal, operational RF amplifier that will be used to amplify the signal coming from a receiving antenna. Said amplifier has a narrow band gain of about 25 dB, a noise figure of less than 0.5 dB, and a small input impedance of less than 2 Ohms, all conditionally stable.

FIG. 4 is a photograph of a representative bias tee for use with one embodiment of this invention. For that tee, a 10V power supply will be connected to the DC port; the RF port will be connected to our mixer; and the RF+DC port will be connected to the op-amp. This will allow the RF signal from the antenna to pass through as well as the 10V DC signal to power the op-amp;

FIG. 5 is a diagrammatic representation of the circuit for the bias tee of FIG. 4;

FIG. 6 illustrates one embodiment of mixer that this invention will use to down convert the signal for the present invention. In that representative embodiment, the RF signal coming in will be a 63.87 MHz signal and the local oscillator will be providing a 64 MHz signal. The two IF signals coming out will be around 130 kHz and 127.87 MHz. It should be noted, however, that these values are for one representative example of DID device and the scope of this invention should not be limited to same.

FIG. 10 is an example of an 8 channel IoT system—(could be one of 4, 8, 16, etc. channel systems); and FIG. 11 is a one channel example of the IoT system shown in FIG. 10 in which. Particularly, therein:

Figure 1:
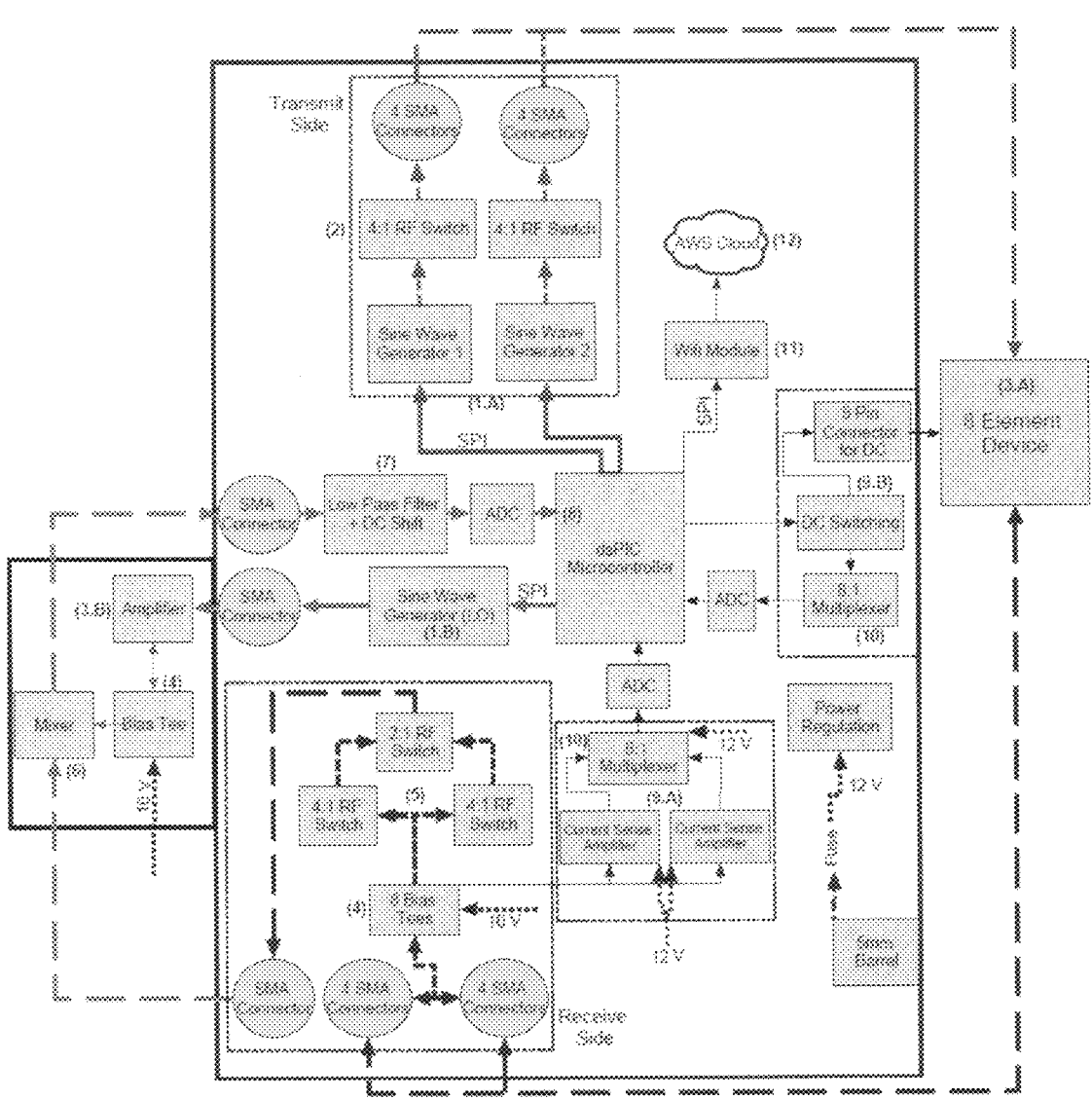
Figure 2:
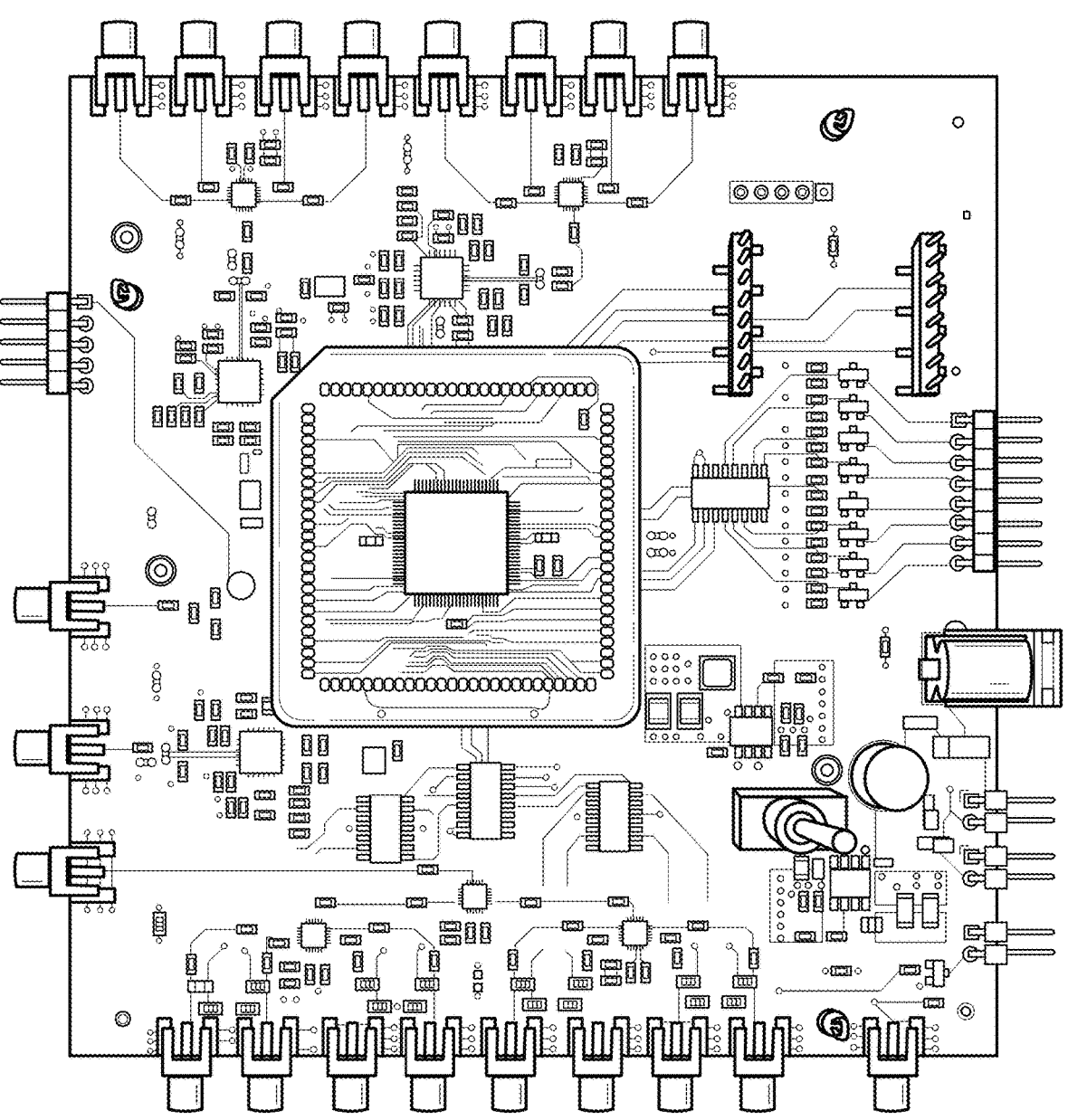
Figure 3:
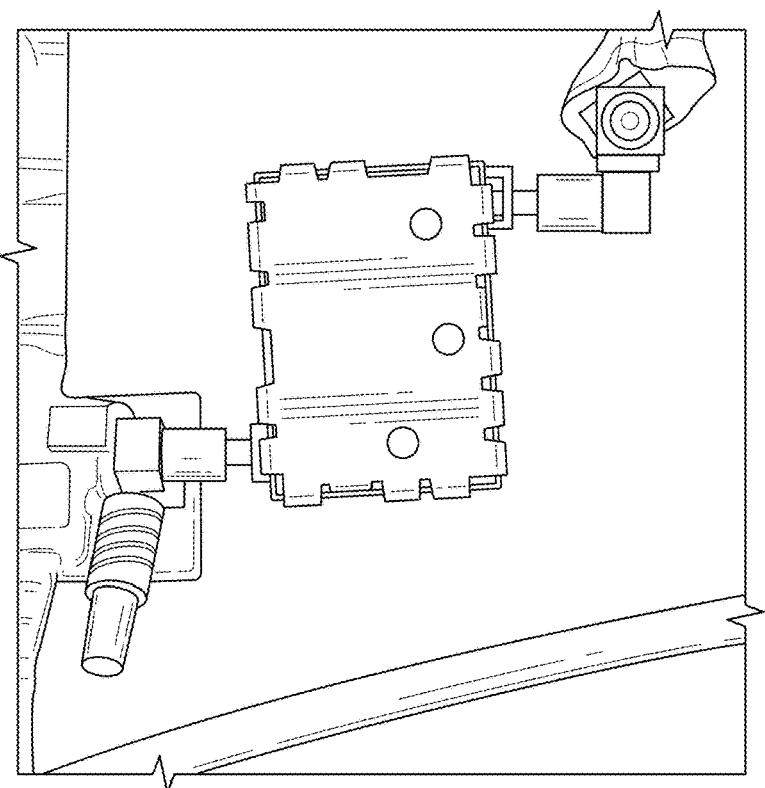
Figure 4:
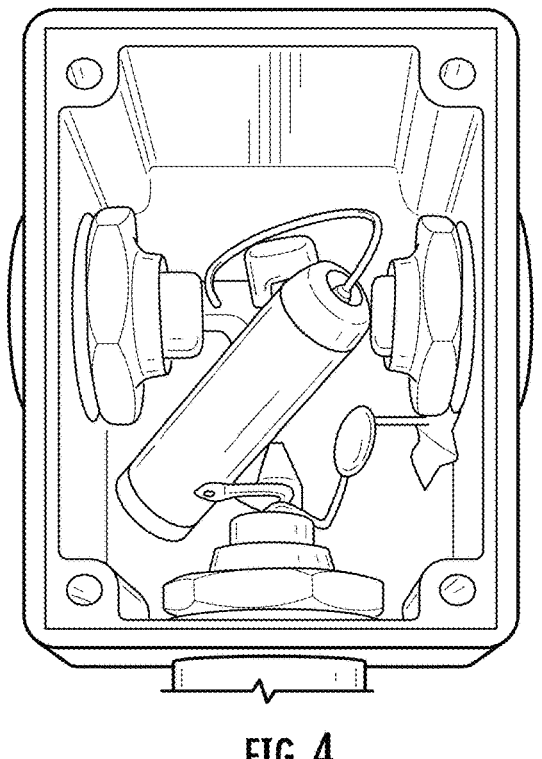
Figure 5:
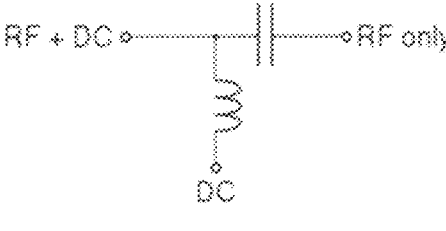
Figure 6:
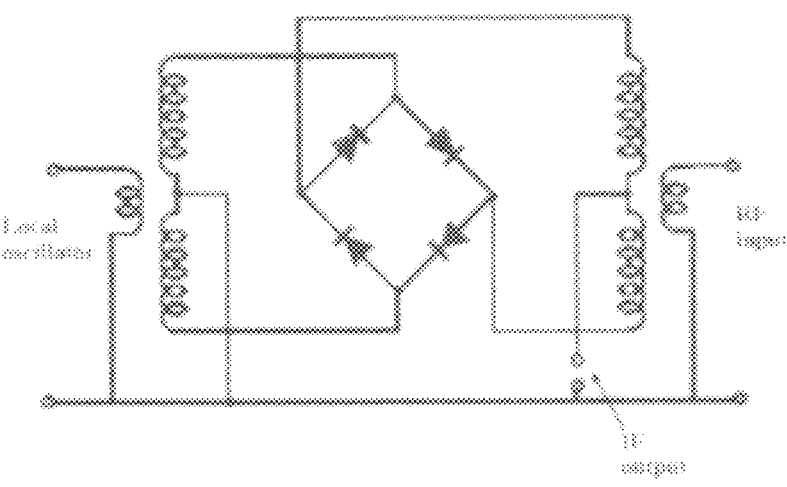
Figure 7:
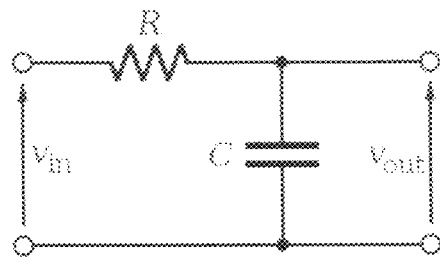
FIG. 7 illustrates a representative signal filtration (i.e., low pass filter) that will be used to eliminate the 127.87 MHz signal as current versions of this invention are unable to do anything meaningful with that signal since it is too fast for the aforementioned ADC. Such a filter will fully eliminate this component.

MRI system block represent the MRI system and all its electronics

L78L33 blocks are the voltage regulators (3 are shown) needed to convert the 10 v DC to 3.3 v DC for both power and logic (see above flow arrows A&B and PWR). The RF switch block is the RF switching IC and its supporting components.

The Coil is the MRI coil; and

The IoT block is the IoT PCB with the switching between IoT and System is based on the logic explained in the representative Logic table (shown in the lower right of FIG. 11).

DETAILED DESCRIPTION OF THE INVENTION

The following detailed description of implementation consistent with the present invention refers to the accompanying photographs and drawings. Also, the following detailed description does not limit the invention. Instead, the scope of the invention is defined by the appended claims and equivalents.

How will it work? When the coil is not in use inside the MRI, the coil will be connected to a Diagnostic Interface Device (DID) that is a fundamental part of this invention. The coil will be plugged into the DID that will measure the status of certain key electrical conditions and transmit the electronic status of the coil (delineated by a specific code number) to a remote storage method via the internet. The information for each coil will be available to the interested service providers and end users who may wish to monitor the status of the MRI coils.

How the coils are tested: An IDT 8V97051 IC chip will generate a representative 63.87 MHz sine wave. The received response of the testing of the RF signal (sine wave) coming from the MRI coil unit under test will be pushed through an amplifier, then a bias tee, then to the RF input of a mixer. This signal is mixed with a 64 MHz sine wave to produce a 130 kHz and 127.87 MHz signal. The signal is then passed through a low-pass filter to eliminate the 127.87 MHz component. Finally, the signal goes to the ADC in the microcontroller to convert the signal into digital data. The center frequency of this signal is calculated within the microcontroller.

This remote diagnostic device, utilizing the Internet of Things (IOT) will remotely monitor MRI coils to detect when a coil is not in an operational state. It will be able to detect soft and hard failures before the coil is needed in the performance of an MRI.

This invention will have an integrated Diagnostic Interface Device (DID) that the MRI coils will plug into when they are not in use inside the MRI. The status of the coils will be transferred from the DID to the service providers and interested end users. The invention should be able to transfer data regarding the status of MRI coils via Wi-Fi module, an SD card or any other memory card.

This invention will detect: MRI coil decoupling failures; mistuned MRI coils due to mechanical failures; MRI coil preamplifier failures; intermittent MRI coil connections; and/or mistuned MRI coils due to component drift.

This invention will utilize Artificial Intelligence (AI) to track the electrical properties of coils—regardless of type or manufacturer.

EDIM—Embedded Diagnostic Interface Module

For another variation, this invention will consist of an Embedded Diagnostic Interface Module (or EDIM) built into the MRI coils of a new apparatus. By utilizing the Internet of Things (IOT) to remotely monitor the status of MRI coils, it will be possible to detect if the coil will malfunction before the coil is used in an MRI procedure.

How will the EDIM work? The MRI coil, itself, will have an embedded sensing device built in—a fundamental part of that invention. Said sensing device will measure the status of certain key electrical conditions and transmit the electronic status of the coil (delineated by a specific code number) to a remote storage area on the internet. The information for each coil will be available to the interested service providers and end users who may wish to monitor the status of the MRI coils.

Figure 8:
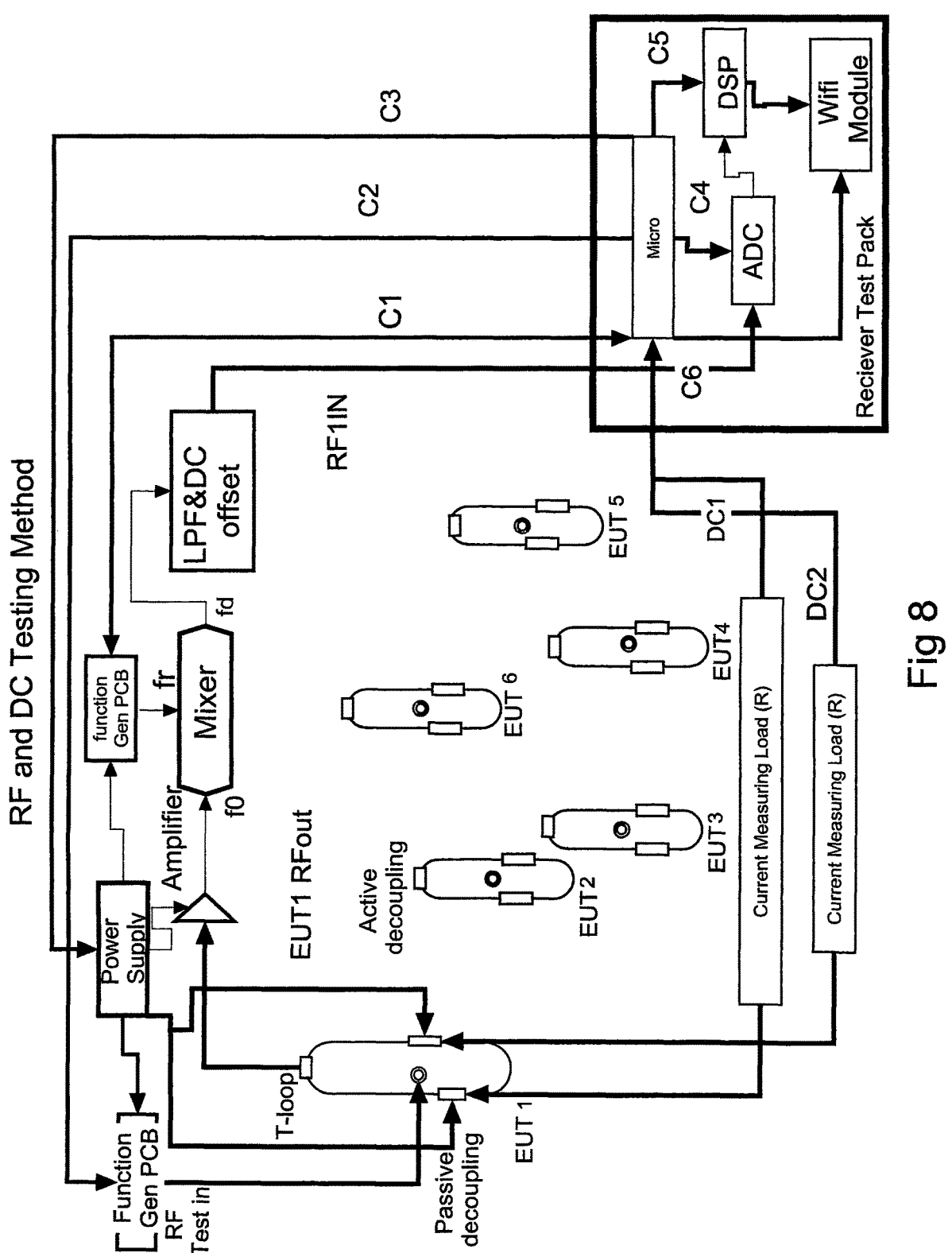
FIG. 8 is a high-level flowchart representing one preferred method of RF/DC coil testing per the present invention.
Figure 9:
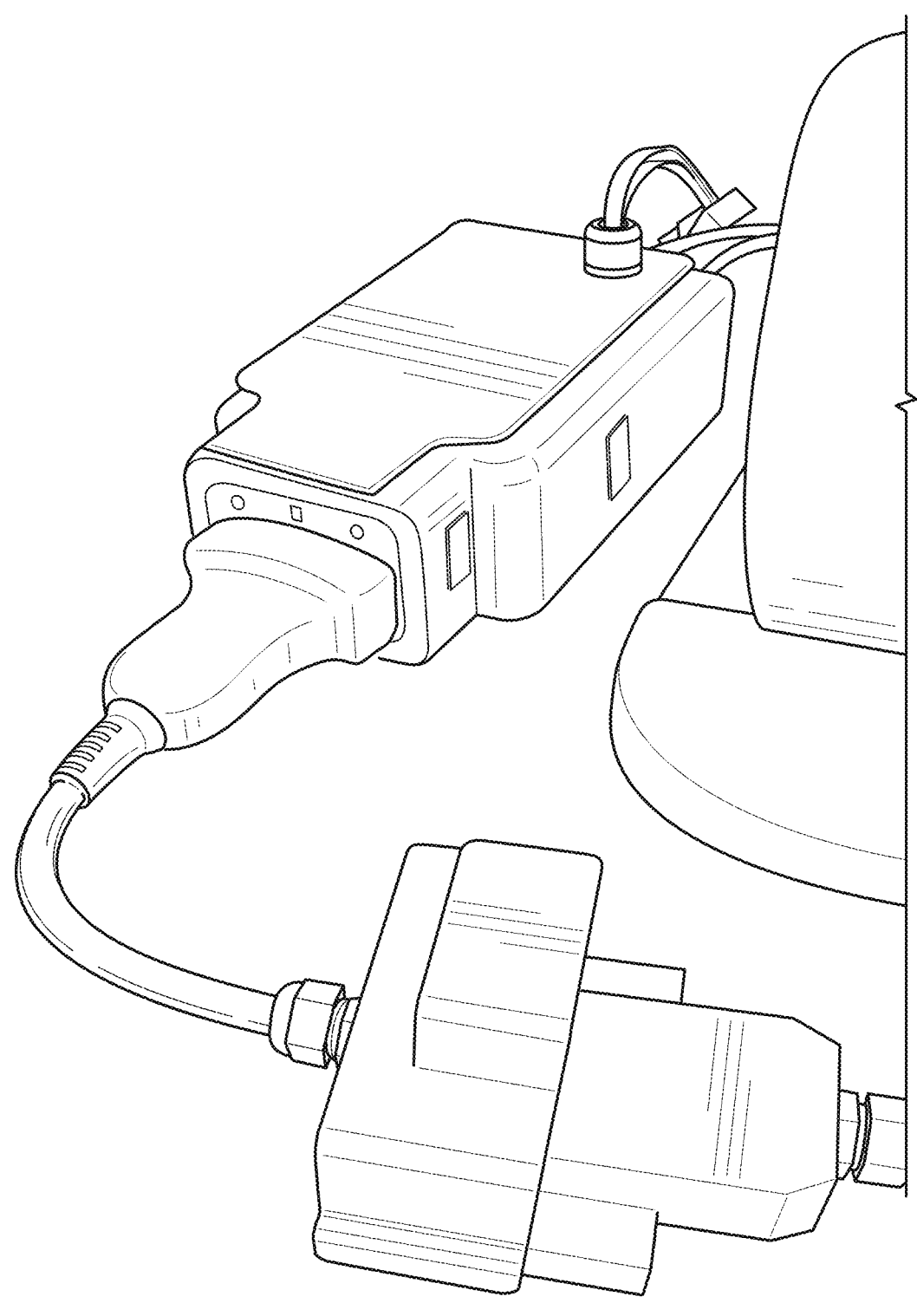
FIG. 9 is a top view photograph of one embodiment of Diagnostic Interface Device (DID) and connector cable per the present invention.

This new embedded device will examine both sides of the coil parameters (both RF and DC) where the following high-level steps of test events will be performed (Preferably, all activities in this device will be controlled by a central control unit such as a microcontroller for controlling signal activation and traffic allowance per FIG. 8):

For RF:
each Element Under Test (EUT) in the coil will have an assigned small signal Amplifier and a drive point. An RF signal will be transmitted at a desired frequency into the EUT. The MRI coil will produce a response to the transmitted RF signal and push that response into the EDIM.
the received signal will then go through a mixer with an LO of desired frequency generated by this RF signal.
the output of the mixer (IF) will be +/− mixed signal in and will go through an LPF where signal is DC offset to go to an ADC
digital signals will then be analyzed via a DSP module
data will then get packaged and sent to a WIFI module where that data will be pushed to the cloud. In the internet cloud, this system will have on a dashboard, an algorithm for analyzing these data points to determine the present condition of a coil element under test.

For DC:
after finishing the RF test, a voltage will be sent each decoupling block in EUT to determine part integrity and functionality.
a DC Signal received for each decoupling block will be pushed to a controlling unit (microcontroller) for packaging this data with the RF data before sending to the cloud. This data will be decoded at cloud level and analyzed to determine DC functionality of each decoupling block.
Per the accompanying FIGS., this is one example (part selection) of implementing an EDIM IoT Device:

EDIM Example

RF Testing
1. The dsPIC33CK256MP508 microcontroller is used to control three 8V97051 Sine Wave Generator chips via 2 Serial Peripheral Interface (SPI) ports.
    A. One SPI port is used to control either Sine Wave Generator 1 or 2 depending on the element we are testing. The Sine Wave Generators output frequencies ranging from 56 MHz to 76 MHz in 0.4 MHz intervals. This gives us 50 points.
    B. This $3^{rd}$ Sine Wave Generator serves as a Local Oscillator (LO) and outputs frequencies ranging from 55.99 MHz to 75.99 MHz in 0.4 MHz intervals. This gives us 50 points.
2. There are two HMC7992 RF Switches to determine which element in the MRI coil device to send a test signal to.
3. The corresponding element responds to said test signal.
    A. The 8-element device contains the elements under test.
    B. The LO signal goes through an amplifier similar to the one in the 8-element device in order to get both signal amplitudes to match.
4. The RF signals, the LO signal, and a 10V DC supply are connected to bias tees. This is so the individual amplifier and the amplifiers in the 8-element device are powered via a 10V supply while also amplifying the RF and LO signals.
5. There are additional HMC7992 RF switches used to determine which element we are testing.
6. The ZFM-150+ mixer outputs a modulated signal, a high and low frequency signal. The low frequency signal should always be around 10 kHz. The high frequency signal will always be filtered out since we cannot analyze this signal.
7. A first order low pass filter is used to eliminate the high frequency signal. Then the low frequency signal gets shifted up via a resistor ladder. This is needed since the ADC on the dsPIC33CK256MP508 cannot see negative voltages.
8. Once the data is digitized, FFT analysis is done to determine the strength of the 10 kHz signals for each of the 50 points.

Preamplifier and De-coupling
9. The preamplifier and de-coupling currents are also measured:
    A. The preamplifier currents are measured using two MAX4378HASD+T current sense amplifiers.
    B. The DC switching is used to control which de-coupling current to test.
10. Two HCF4051YM013TR 8:1 multiplexers are used to decide which element's preamplifier/de-coupling current to test.
11. The $3^{rd}$ SPI port is used to send the power and frequency data to Wi-Fi module AC164164. The Wi-Fi module pushes that data into the Amazon Web Services (AWS) Cloud.

12. The backend infrastructure is built from AWS cloud services. A data processing engine is built with the help of AWS IoT core and Lambda. AWS is also used to store data and deploy the dashboard application. In the cloud, we analyze data (RF&DC) coming real time from CUT (coil under test) and determine status of all functional parameter of the coil.

The foregoing employs the following, representative Power Management;

| | | |
|---|---|---|
| dsPIC33CK256MP508 Microcontroller | 10 V | 100 mA |
| 8V97051 Sine wave generators | 3.3 V | 390 mA |
| Op-Amps | 10 V | 70 mA |
| AC164164 Wi-Fi module | 3.3 V | 20 mA |
| DC Shifting Circuit | 3.3 V | 50 mA |
| Active Decoupling | 10 V | 40 mA |

With the preceding Embedded Diagnostic Interface Module (EDIM), it will remotely monitor MRI coils and detect when a coil is not in an operational state utilizing the Internet of Things (IOT). It will be able to detect both soft and hard failures before the coil is needed in the performance of an MRI.

This alternate embodiment of the present invention will have an integrated Diagnostic Interface Module (DIM) thus giving it an ability to perform as a self-testing device. The status of the coil will be transmitted to a cloud services app for Applicants' analytics modules to derive conclusions and recommendations from the DIM to MRI service providers and other interested end users.

This version will be able to transmit data regarding the status of the subject MRI coil via a Wi-Fi module (internal or external), an SD card or other memory card.

This invention will detect both soft and hard failures. Examples of soft failures include: poor image quality due to Signal-to-Noise ratios below specification or various image artifacts while examples of a hard failure include a complete lack of an image.

The Embedded Diagnostic Interface Module, or EDIM, will detect: MRI coil decoupling failures, mistuned MRI coils due to mechanical failures, MRI coil preamplifier failures, intermittent connection detections of MRI coils, and mistuned MRI coils due to component drift. It will utilize Artificial Intelligence (AI) to track the electrical properties of coils and learn to predict when a coil will fail before the failure occurs.

Referring now to FIGS. 10 and 11, there is shown a representative RF switching channel diagram (FIG. 10) and corresponding block diagram representation of same (FIG. 11). For the RF Switching PCB therein, the board itself will rout the receiving signal from the coil under test to either the IoT PCB or the MRI system. The control logic lines for the RF switching ICs will be provided by a 10 v line from the MRI system. When the coil is not plugged in the MRI system, the logic lines will be Low and the RF Switching IC ill rout the RF coming from the coil to IoT PCB. But in the IoT operation mode, DC power from the RF Switching PCB will be provided by the IoT PCB.

FIG. 10 is an example of an 8 channel IoT system—(could be one of 4, 8, 16, etc. channel systems). This diagram shows the complete RF/DC routing paths from/to IoT, coil and MRI system with Embedded Tx/Test Loops shown on the upper right. Note:

1. RF switching printed circuit board (or PCB) is made of multiple RF switching integrated chips (or ICs) (for example HMC7992) and voltage regulators (for example L78L33) with their supporting components. The number of RF switching ICs used depends on how many channels the MRI coil has.

2. COIL (upper right) is the unit under test and it could be a Receive only or a Transmit/Receive coil.

3. The MRI system block will provide the power and logic A/B (as seen in FIG. 11) for the RF switching ICs via 10 v DC, for example.

4. There are two possible events in this diagram:

Enable 1—When the coil is in use (i.e., plugged in the MRI system), the coil works as an imaging apparatus and there is no IoT diagnostic testing of the coil happening. The MRI system will provide all needed voltages and logic lines for the RF switching PCB to route all coil channels to MRI system Enable 2—When the coil is not in use (not plugged in the MRI system) the coil channels are routed to IoT for diagnostic testing. All needed voltages and logic for the RF switching PCB will be provided by the IoT PCB. IoT PWR is external;

FIG. 11 is a one channel example of the IoT system shown in FIG. 10 in which. Particularly, therein:

MRI system block represent the MRI system and all its electronics

L78L33 blocks are the voltage regulators (3 are shown) needed to convert the 10 v DC to 3.3 v DC for both power and logic (see above flow arrows A&B and PWR). The RF switch block is the RF switching IC and its supporting components.

The Coil is the MRI coil; and

The IoT block is the IoT PCB with the switching between IoT and System is based on the logic explained in the representative Logic table (shown in the lower right of FIG. 11).

HDIM—Handheld Digital Interface Module

For a handheld version, also known as a Handheld Diagnostic Interface Module (HDIM), it will utilize the Internet of Things (IOT) to allow field service personnel to monitor MRI coils on site. Such personnel can simply plug into any given MRI coil for detecting when that coil is not fully operational. The HDIM will be able to detect both soft and hard failures before the coil is needed in the performance of an MRI. This design will allow field service engineers to troubleshoot more quickly. It will also give such engineers the capability of repairing or replacing an MRI coil before it fails.

The device will examine both sides of the coil parameters (both RF & DC) where the following high-level description of test event steps may take place (Keep in mind all activities with this device may be controlled by a central control unit such as a microcontroller for controlling signal activation and traffic allowance. See, FIG. 8):

For RF:

Each Element Under Test (EUT) in the coil will have an assigned small signal amplifier and a drive point. An RF signal will be transmitted at a desired frequency into the EUT. The MRI coil will produce a response to the transmitted RF signal and push that response into the HDIM.

the received signal then will go through a mixer with an LO of desired frequency generated by our RF signal.

the output of the mixer (IF) will be +− of mixed signal in and will go through a LPF where signal is then DC offset to go to an ADC digital signals are then analyzed via a DSP module data then gets packaged and sent to WIFI module where it will be pushed to the cloud in the cloud, we will have an algorithm that will review
 data points for determining the condition of an MRI
 coil element under test.
 For DC:
 after finishing the RF test, this version of the system will
 send a voltage to each decoupling block in EUT to
 determine part integrity and functionality.
 the DC Signal received for each decoupling block will be
 pushed to a controlling unit (or microcontroller) to
 package this data with the RF data before sending to the
 cloud. That data will be decoded at cloud level and
 analyzed to determine DC functionality of each decou-
 pling block.
 Per the accompanying FIGS., this is one example (part
 selection) of implementing an HDIM IoT Device:

HDIM Example

RF Testing
 1. The dsPIC33CK256MP508 microcontroller is used to
 control three 8V97051 Sine Wave Generator chips via 2
 Serial Peripheral Interface (SPI) ports.
   A. One SPI port is used to control either Sine Wave
      Generator 1 or 2 depending on the element we are
      testing. The Sine Wave Generators output frequencies
      ranging from 56 MHz to 76 MHz in 0.4 MHz intervals.
      This gives us 50 points.
   B. This $3^{rd}$ Sine Wave Generator serves as a Local
      Oscillator (LO) and outputs frequencies ranging from
      55.99 MHz to 75.99 MHz in 0.4 MHz intervals. This
      gives us 50 points.
 2. There are two HMC7992 RF Switches to determine
 which element in the MRI coil device to send a test signal
 to.
 3. The corresponding element responds to said test signal.
   A. The 8-element device contains the elements under test.
   B. The LO signal goes through an amplifier similar to the
      one in the 8-element device in order to get both signal
      amplitudes to match.
 4. The RF signals, the LO signal, and a 10V DC supply
 are connected to bias tees. This is so the individual amplifier
 and the amplifiers in the 8-element device are powered via
 a 10V supply while also amplifying the RF and LO signals.
 5. There are additional HMC7992 RF switches used to
 determine which element we are testing.
 6. The ZFM-150+ mixer outputs a modulated signal, a
 high and low frequency signal. The low frequency signal
 should always be around 10 kHz. The high frequency signal
 will always be filtered out since we cannot analyze this
 signal.
 7. A first order low pass filter is used to eliminate the high
 frequency signal. Then the low frequency signal gets shifted
 up via a resistor ladder. This is needed since the ADC on the
 dsPIC33CK256MP508 cannot see negative voltages.
 8. Once the data is digitized, FFT analysis is done to
 determine the strength of the 10 kHz signals for each of the
 50 points.
 Preamplifier and De-Coupling
 9. The preamplifier and de-coupling currents are also
 measured:
   A. The preamplifier currents are measured using two
      MAX4378HASD+T current sense amplifiers.
   B. The DC switching is used to control which de-coupling
      current to test.
 10. Two HCF4051YM013TR 8:1 multiplexers are used to
 decide which element's preamplifier/de-coupling current to
 test.

11. The $3^{rd}$ SPI port is used to send the power and
 frequency data to Wi-Fi module AC164164. The Wi-Fi
 module pushes that data into the Amazon Web Services
 (AWS) Cloud.
 12. The backend infrastructure is built from AWS cloud
 services. A data processing engine is built with the help of
 AWS IoT core and Lambda. AWS is also used to store data
 and deploy the dashboard application. In the cloud, we
 analyze data (RF&DC) coming real time from CUT (coil
 under test) and determine status of all functional parameter
 of the coil.
 Similar to the EDIMI system above, this HDIM employs
 the following representative Power Management:

| | | |
|---|---|---|
| dsPIC33CK256MP508 Microcontroller | 10 V | 100 mA |
| 8V97051 Sine wave generators | 3.3 V | 260 mA |
| Op-Amps | 10 V | 70 mA |
| AC164164 Wi-Fi module | 3.3 V | 20 mA |
| DC Shifting Circuit | 3.3 V | 50 mA |
| Active Decoupling | 10 V | 40 mA |

The Handheld Diagnostic Interface Module (HDIM) ver-
sion of this invention will utilize the Internet of Things
(IOT) to allow field service personnel to monitor MRI coils
on site and detect when a coil is not fully operational. It will
be able to detect both soft and hard failures before the coil
is needed in the performance of an MRI.

This device (and related method of use) will allow field
service engineers to troubleshoot more quickly. It will also
give them the capability to repair or replace an MRI coil
before it fails.

Ideally, this embodiment of the present invention will be
in the form of a handheld device that will have an integrated
Diagnostic Interface Module (DIM) thus giving it the ability
to perform as a self-testing device. The status of any tested
coil may be viewed on site and will be transmitted to a cloud
services app for analytics modules to derive conclusions and
recommendations from the DIM to MRI service providers
and other interested end users.

This invention will transmit data regarding the status of
the subject MRI coil via Wi-Fi module, an SD card or other
memory card. It will detect both soft and hard failures.
Examples of a soft failure including poor image quality due
to Signal-to-Noise ratios below specification or various
image artifacts. And examples of a hard failure including a
complete lack of an image.

The Handheld Diagnostic Interface Module (HDIM) ver-
sion of this invention should be able to detect: MRI coil
decoupling failures, mistuned MRI coils due to mechanical
failures, MRI coil preamplifier failures, intermittent connec-
tion detections of MRI coils and/or mistuned MRI coils due
to component drift. The invention will utilize Artificial
Intelligence (AI) to track the electrical properties of coils
and learn to predict when a coil will fail before the failure
occurs.

Having described the best modes currently known for
practicing this device/system and method, it is to be under-
stood that the scope of this invention may be further
described by the attached claims.

SEQUENCE LISTING

Not applicable

What is claimed is:

1. An MRI coil having embedded therein a system for diagnosing a potential electrical failure in the MRI coil, said embedded diagnosing system for said coil including:

(a) an embedded Diagnostic Interface Device (DID) that includes:

(i) a section for transmitting one or more electrical testing signals to the MRI coil, said transmitting section including a routing printed circuit board (PCB);

(ii) a section for receiving responses from the MRI coil to the electrical testing signals transmitted by the DID to the MRI coil;

(iii) a section for manipulating the MRI responses received, said manipulating section including: a gain block, an RF signal mixer and a signal filtration;

(iv) a section for digitizing the manipulated responses received from the MRI coil;

(v) a section for performing signal processing on the digitized, MRI responses received; and (vi) a section for transferring signal processed responses for the MRI coil to a remote storage area and conducting periodic comparative analytics on the transferred signal processed responses; and (b) means for connecting the embedded diagnosing system DID of the MRI coil to a frequency-testing power source.

2. An MRI coil having built into it a system for electronically evaluating on a repeated basis whether the MRI coil has failed or may soon fail, said system comprising:

(a) a fully embedded Diagnostic Interface Device (DID) integrated into the MRI coil during its initial assembly/construction, said embedded DID including:

(i) a section for transmitting to the coil under test a routing printed circuit board (PCB) for transmitting to the coil one or more electrical test signals including:
one or more RF signals, and
one or more signals for evaluating DC status of the coil under test;

(ii) a section for receiving from the coil under test RF signal responses to the RF signals transmitted by the embedded DID;

(iii) a section for manipulating the RF signal responses received from the coil under test with at least one programmable unit/logic device selected from the group consisting of a microcontroller, a Field Programmable Gate Array (FPGA), a Programmable Logic Device (PLD) and a System on a Chip (SoC);

(iv) a section for digitizing the manipulated RF signal responses received;

(v) a section for performing signal processing on the digitized, manipulated RF signal responses received;

(vi) a section for transferring signal processed responses for the coil under test to a dashboard using at least one of: a WiFi module, an SD card and a memory card, said dashboard adapted for conducting periodic comparative analytics on the transferred signal processed responses; and determining whether the coil under test has failed or may soon fail; and (b) means for connecting the embedded DID of the MRI coil to a frequency-testing power source.

3. A method for predicting soft or hard failure of an MRI coil, said method comprising the steps of:

(a) providing a Diagnostic Interface Device (DID) that includes:

(i) a section for transmitting to the MRI coil when not in service a plurality of electronic signals including:
test RF signals, and
one or more signals for evaluating DC status of the MRI coil;

(ii) a section for receiving responses of the MRI coil to the plurality of electronic signals transmitted by the embedded DID;

(iii) a section for manipulating the MRI coil responses received with at least one programmable unit/logic device selected from the group consisting of a microcontroller, a Field Programmable Gate Array (FPGA), a Programmable Logic Device (PLD) and a System on a Chip (SoC);

(iv) a section for digitizing the MRI coil responses manipulated so that the programmable unit/logic device may perform signal processing thereon; and (v) a section for transferring the digitized, signal processed responses for the MRI coil to a remote storage area so that periodic comparative analytics may be conducted thereon, said transmitting section including at least one of: a WiFi module, an SD card and a memory card;

(b) embedding the DID into the MRI coil during its initial assembly/construction;

(c) sending the plurality of electronic signals to the embedded DID of the MRI coil;

(d) receiving the responses received by the embedded DID from the plurality of electronic signals transmitted to the MRI coil;

(e) manipulating the responses received with the programmable unit/logic device;

(f) digitizing the manipulated responses received;

(g) performing signal processing on the digitized, manipulated responses;

(h) transferring the signal processed responses to a remote storage area on the internet; and (i) conducting periodic comparative analytics on the transferred signal processed responses to remotely determine whether the MRI coil is functioning satisfactory, has already failed or is susceptible to imminent failure.

4. The MRI coil of claim 1 wherein transmitting section (i) includes at least one of: means for aiming at least one RF signal toward the embedded DID; and a sine wave generator.

5. The MRI coil of claim 1, which is Receiving Only coil or a Transmitting/Receiving (T/R) coil.

6. The MRI coil of claim 1 wherein transmitting section (i) further includes means for transmitting one or more signals to evaluate DC status of the MRI coil.

7. The MRI coil of claim 1 wherein receiving section (ii) includes means for capturing a waveform frequency response from the MRI coil.

8. The MRI coil of claim 1 wherein manipulating section (iii) includes: a DC offset, at least one programmable unit/logic device selected from the group consisting of a microcontroller, a Field Programmable Gate Array (FPGA), a Programmable Logic Device (PLD) and a System on a Chip (SoC).

9. The MRI coil of claim 1 wherein the gain block for manipulating section (iii) includes an amplifier.

10. The MRI coil of claim 1 wherein manipulating section (iii) further includes means for adding a local oscillator (LO) signal to the MRI coil response received by the embedded DID.

11. The MRI coil of claim 1 wherein signal processed response transferring section (vi) includes an internal or external WiFi module.

12. The MRI coil of claim 1 wherein signal processed response transferring section (vi) includes an SD card or memory card.

13. The MRI coil of claim 1, which can be used to detect soft or hard failures.

14. The MRI coil of claim 2 wherein manipulating section (iii) includes one or more of: a gain block, an RF signal mixer, a signal filtration and a DC offset.

15. The MRI coil of claim 14, wherein manipulating section (iii) further includes means for adding a local oscillator (LO) signal to the RF signal responses received from the coil under test.

16. The MRI coil of claim 2, which is Receiving Only coil or a Transmitting/Receiving (T/R) coil.

17. The method of claim 3 wherein step (e) includes the sub-step of adding a local oscillator (LO) signal to the responses received.

18. The method of claim 3 wherein manipulating section (iii) of the embedded DID further includes one or more of: a gain block, an RF signal mixer, a signal filtration and a DC offset.

19. The method of claim 3 wherein the WIFI module is internal to the embedded DID.

* * * * *